United States Patent [19]

Lassmann et al.

[11] Patent Number: 4,686,455

[45] Date of Patent: Aug. 11, 1987

[54] METHOD FOR THE LOCALIZATION OF TIME-CRITICAL EVENTS WITHIN A CLOCK ELECTRONIC CIRCUIT

[75] Inventors: Reiner Lassmann; Albert Krupp; Peter Fazekas, all of Munich, Fed. Rep. of Germany

[73] Assignee: Siemens Aktiengesellschaft, Berlin and Munich, Fed. Rep. of Germany

[21] Appl. No.: 636,925

[22] Filed: Aug. 2, 1984

[30] Foreign Application Priority Data

Sep. 30, 1983 [DE] Fed. Rep. of Germany ....... 3335671

[51] Int. Cl.$^4$ ............... G01R 15/12; G01R 31/00; G01R 31/28
[52] U.S. Cl. ............... 324/73 R; 324/158 R; 371/25
[58] Field of Search ............... 371/15, 20, 25, 24, 371/27; 324/73 R, 73 AT

[56] References Cited

U.S. PATENT DOCUMENTS

| | | | |
|---|---|---|---|
| 3,497,685 | 11/1965 | Stafford et al. | 324/73 R |
| 3,916,306 | 10/1975 | Patti | 324/73 R |
| 4,220,854 | 9/1980 | Feuerbaum | 250/310 |
| 4,277,679 | 7/1981 | Feuerbaum | 250/310 |
| 4,503,536 | 3/1985 | Panzer | 371/25 |

FOREIGN PATENT DOCUMENTS 0081295  6/1983  European Pat. Off. .
3040733  5/1982  Fed. Rep. of Germany .
3104121  9/1982  Fed. Rep. of Germany .

Primary Examiner—Reinhard J. Eisenzopf
Assistant Examiner—Vinh P. Nguyen
Attorney, Agent, or Firm—Hill, Van Santen, Steadman & Simpson

[57] ABSTRACT

Time-critical events are localized within a clocked electronic circuit without requiring cyclical operation By way of measuring at the outputs of the circuit, the limit frequency of the circuit is identified. A test pattern sequence is then applied to this circuit. The number n of that test pattern at which errors are perceived at the outputs is identified, in particular with a clock frequency higher than the identified limit frequency of the circuit. The test patterns having the numbers n−m are applied to the circuit with a clock frequency greater than the identified limit frequency of the circuit and the remaining n test patterns are applied to the circuit with a clock frequency lower than the identified limit frequency of the circuit, being applied thereto in succession step-by-step with m=1,2,3 ... in at least one run of n test patterns. A check is carried out after every run of a test pattern sequence of n test patterns as to whether an error still exist at the output until an error can no longer be documented at the output and a determination is thus made with respect to which test pattern having the number n−m the error is generated within the −circuit. An error tracking technique is carried out in order to localize the cause of error within the electronic circuit.

9 Claims, 4 Drawing Figures

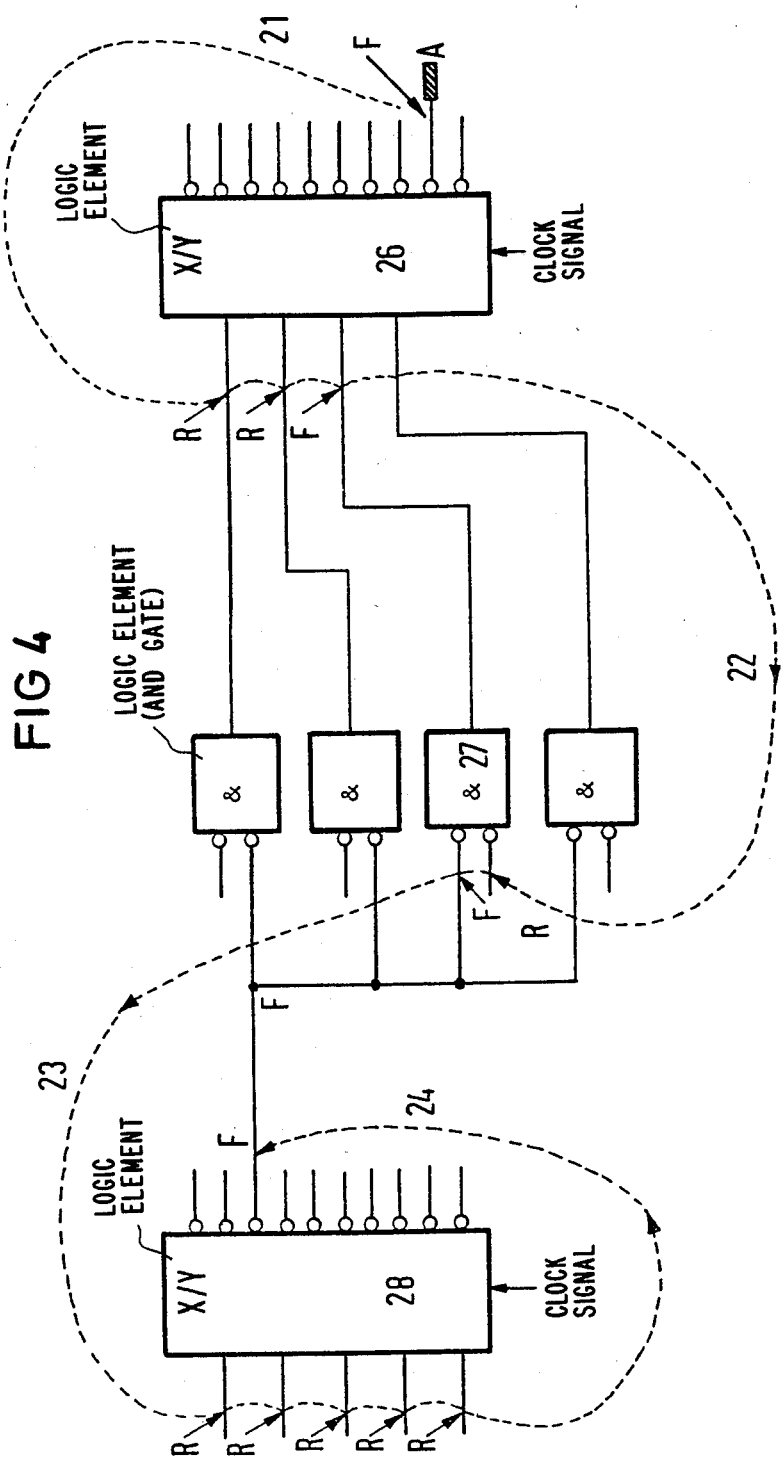

4,686,455

METHOD FOR THE LOCALIZATION OF TIME-CRITICAL EVENTS WITHIN A CLOCK ELECTRONIC CIRCUIT

BACKGROUND OF THE INVENTION

1. Field of the Invention

The present invention relates to a method for testing electronic circuits, and more particularly to a method for localizing time-critical events within a clocked electronic circuit.

2. Description of the Prior Art

A non-pulsed electron probe suitable for acquiring logical states at internal nodes of integrated circuits. During the test of an internal measuring point, the probe is positioned to the measuring point and a test pattern sequence is applied to the inputs of the integrated circuit. Given the use of an electronic probe, the transient time of a measuring signal achieved with the electron probe amounts, for example, to 1 ms. The chronological spacing of two successive test patterns must therefore last a few milliseconds in order to guarantee an accurate evaluation of the signal taken from the internal measuring point of the integrated circuit. Such a known method is only suited for clocked synchronous circuits having a relatively low clock frequency because the chronological spacing of two test patterns given this known method with a non-pulsed electron probe must amount to a few milliseconds. Given such slow operation, no statement is possible regarding the chronological behavior of an electronic circuit having a clock frequency above 1 kHz.

Dynamic events in integrated circuits were previously acquired with a sampling method disclosed in U.S. Pat. No. 4,220,854, fully incorporated herein by this reference. Given such a sampling method, however, a cyclical test pattern sequence which can only have a short length must be employed. The use of a cyclical test pattern sequence of short length, however, is not suitable for testing every electronic circuit, for examplye such is hardly suited for testing a logic circuit having numerous sequential stages.

SUMMARY OF THE INVENTION

The object of the present invention is to provide a method of the type initially mentioned with which time-critical events within clocked integrated circuits can be localized without cyclical operation being necessary.

According to the invention, the above object is achieved in a method for localizing time-critical events within a clocked electronic circuit, the method being characterized in that the limit frequency of the circuit is identified by way of measurement at the outputs, a test pattern sequence is applied to the circuit, and the number n of that test pattern whereat an error is perceived at the outputs is determined, namely at a clock frequency higher than the identified limit frequency of the circuit. More specifically, the test patterns having the numbers n−m and having a clock frequency higher than the identified limit frequency of the circuit and the remaining m test patterns having a clock frequency lower than the identified limit frequency of the circuit are successively applied to the circuit in at least one run of n test patterns step-by-step with m=1,2,3 . . . , whereby a test is carried out after every run of a test pattern sequency of n test patterns as to whether the error still exists at the output until no error can be documented at the output, and an identification has thus been made regarding at which test pattern having the number n-m the error is generated within the circuit. An error tracking is executed in order to localize the cause of a fault within the electronic circuit.

Although the invention is explained in greater detail below with reference to an electron beam probe, it can also be utilized with a laser scanner or some other probe.

Essential to the invention is that the limit frequency of the circuit is determined by measurement at the terminals of the electronic circuit under test. A test pattern sequence is then applied to the electronic circuit, in particular at a frequency which is higher than the previously-identified limit frequency and which is therefore certain to lead to an error at the outputs. Given a specific test pattern having the number n in this test pattern sequence, an error is perceived for the first time at an output of the circuit. In order to then discover at which test pattern this error perceived at the output of the circuit at the test pattern including the number n had arisen within the circuit, the test pattern sequence, which is now reduced to the first n test patterns, is applied to the circuit in at least one run of the test pattern sequence with a frequency which lies above the limit frequency and such that the remaining m test patterns of the reduced test pattern sequence are applied at a frequency which is lower than the limit frequency. In the first run of the reduced test pattern sequence, m assumes the value 1, assumes the value 2 in a second test run, etc. A check is carried out after every run of the reduced test pattern sequency to see whether the error in the test pattern perceived with the number n in that method step in which all test patterns had been applied with a frequency higher than the limit frequency still appears at the output. As long as that test pattern n−M whereat an error had been first generated within the circuit is applied to the circuit with a frequency higher than the limit frequency, an error caused as a result thereof will be determined at the output at the test pattern n. When this test pattern having the number n−M is applied to this circuit for the first time with a frequency lower than the limit frequency of the circuit, an error caused as a result thereof will no longer be able to be documented at the output of the circuit. Should more than one cause of error exist within the circuit, then more and more test patterns having a frequency lower than the limit frequency must be applied to the circuit until no error whatsoever can be documented at the output of the circuit.

With the method of the present invention, therefore, a first cause of error can be identified and further causes of error can be identified and eliminated after elimination of the first cause of error. The circuit must be initialized before application of each and every test pattern sequence.

When a determination has been made that an error has been generated within the circuit at a test pattern having the number n−M, there are a number of possibilities of discovering the cause of error. Since the error generated at the test pattern having the number n−M cannot be documented at the output of the circuit until the test pattern having the number n, the cause of error lies at a distance of M sequential stages from this output. Since the test patterns having the numbers n−M and n−M−1 are known, and since it is known that the test pattern having the number n−M takes effect at the critical logic element but the test Pattern having the number n−M−1 no longer takes effect, the Possible cause of error coming into consideration can be narrowed down on the basis of the circuit list. The cause of error can then be designationally discovered with the assistance of a probe or with the assistance of registers which are provided with connections to possibly error-affected, critical logic elements that come into consideration, or by way of applying further test patterns.

A further possibility of discovering a cause of error may be carried out utilizing a so-called error path tracking technique. In at least one run, respectively n−M test patterns having a frequency higher than the limit frequency and a further M−p test patterns having a frequency lower than the limit frequency are thereby applied to the circuit. In the first run, p assumes the value 0, the value 1 in the second run, etc. In the first run, the error caused at the test pattern having the number n−M appears at the output of the circuit at the test pattern having the n. In the second run, this error appears at a distance of one sequential stage from this error-affected output. In the run having the number p+1, the error appears p sequential stages from the error-affected output. The error path thereby existing is tracked with a probe.

BRIEF DESCRIPTION OF THE DRAWINGS

Other objects, features and advantages of the invention, its organization, construction and operation will be best understood from the following detailed description, taken in conjunction with the accompanying drawing, on which:

FIG. 4 is a schematic representation of an example of error path tracking.

DESCRIPTION OF THE PREFERRED EMBODIMENTS

Figure 1:
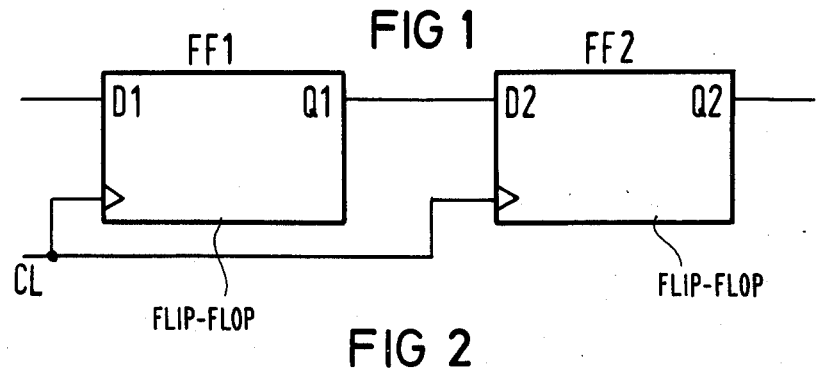
FIGS. 1-3 are schematic illustrations for explaining the underlying principle of the invention, with FIG. 1 showing a logic diagram of a simple synchronous circuit and FIGS. 2 and 3 illustrating clocking and responses at the designated points of the circuit of FIG. 1.
Figure 2:
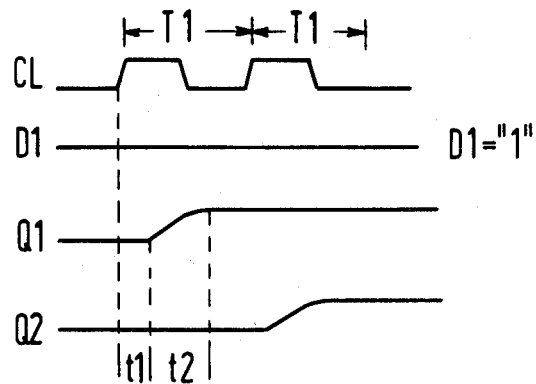
Figure 3:
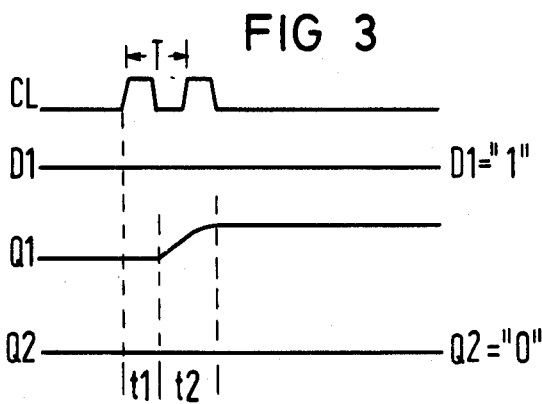

Referring to FIGS. 1-3, the underlying principle of the invention is illustrated. Here, FIG. 1 is a logic diagram of an example of a simple synchronous circuit. This circuit comprises two edge-controlled D flip-flops FF1 and FF2 and operates error-free up to arbitrarily low clock frequencies. The upper limit frequency fa of this circuit is defined, on the one hand, by the signal transit time within the logic elements FF1 and FF2, as well as by the allocated connecting paths and, on the other hand, by the rise time or, respectively, fall time of the signals. The limit frequency fa of this circuit derives as that clock frequency at which the chronological spacing Ta between two successive clock pulses is equal to the sum of the delay time t1 and rise time t2 of that logic element of the circuit which has the highest sum value for the sum of delay time t1 and rise time t2.

An electron probe or laser scanner can, for example, be employed for the localization of time-critical events within clocked integrated circuits. The use of an electron probe for the evaluation of logical levels is disclosed in U.S. Pat. No. 4,277,679, fully incorporated herein by this reference. Since the transient time of the measuring signal can amount to a few milliseconds given the use of an electron probe, an interruption of the clock CL across the required signal evaluation time is required for reliable signal evaluation given the use of an electron probe. On the other hand, the two appertaining output signals Q1 and Q2 are required for a test pattern applied to the input D1. Further, the passage of the test pattern applied to the input D1 through the circuit of FIG. 1 must be investigated at frequencies above and below the limit frequency fa in order to be able to detect a possible cause of error. In the example of FIG. 1, one and the same test pattern is therefore applied to the input D1 during two successive clock pulses and the clock CL is interrupted after the conclusion of these two clock pulses in order to provide an opportunity to be able to position the electron probe to a respective measuring point with the signal Q1 and to a further measuring point with the signal Q2 and in order to be able to arrive at statements regarding the operation of the circuit. Time-critical events can be quasi-statically determined in synchronous circuits by applying the test pattern to the input D1 and the clock CL in double steps and by a subsequent signal evaluation of two signals Q1 and Q2 which are located in successive sequential stages.

When the chronological spacing T1 of two successive clock pulses is selected of sufficient size, as illustrated in FIG. 2, then the circuit of FIG. 1 operates without error. In the second clock, the signal Q2 assumes the logical value "1".

When the chronological spacing T1 of two successive clock pulses is selected smaller than the sum of the delay time t1 and the rise time t2, as shown in FIG. 3, then the output signal at the output Q2 of the flip-flop FF2 is not set to the logical value "1" by the second clock pulse. The signal evaluation following the two clocks then shows that there is an error at the output Q2. Given an exemplary method according to FIGS. 1-3, each test pattern must be respectively applied to the circuit in two successive clocks.

A method according to FIGS. 1-3 can also be carried out such that the clock CL is interrupted for signal evaluation after two respective, successive clocks and that the test patterns change after each clock pulse. The chronological behavior of the circuit shown in FIG. 1 is investigated after every second test pattern is fashioned. Two runs are then necessary, one for the investigation of one half of the measuring signals and a second run for the investigation of the second half of the measuring signals. An arbitrary selection of measuring signals can also be undertaken.

FIG. 4 illustrates an example of error path tracking. The limit frequency fa of the circuit is first determined, for example at 5 MHz, by way of measurements at the outputs of the circuit. A test pattern sequence is then applied to this circuit. That test pattern whereat an error was perceived at the outputs of a circuit for the first time is thereby determined with the number n, namely given a frequency higher than the limit frequency fa, for example given 5.5 MHz. A check is then undertaken to see at which test pattern the error is generated within the circuit. This occurs, for example, in several runs. Test patterns up to the number n−M are applied with the frequency higher than the limit frequency fa. The remaining m test patterns are applied with the frequency lower than the limit frequency fa, for example at 4.5 MHz. A check is made after every run of the n test patterns as to whether the error still appears at the output. The number m is increased in steps of 1 until an error can no longer be documented at the output of the circuit. This is the case when the fast sequence of the test patterns is applied with a frequency higher than the limit frequency fa no longer become effective at the critical logic element. For example, an error can no longer be documented at the output of the circuit for the first time for m−M+1.

In the error path tracking method, n−M test steps having a frequency higher than the limit frequency fa are offered. An error is thereby generated within the circuit. These n−M test patterns are applied to the circuit first in every test pattern run. In the first test pattern run, M further test patterns having a frequency lower than the limit frequencies fa are then applied to the circuit. At the end of the first test pattern run, an error F exists at the output A and can, for example, be identified as such with the electron probe in a specific evaluation time. It is found that this faulty output A is fed by an output of the logic element 26. In a second test pattern run, a further M−1 test patterns are applied in addition to the first n−M test Patterns. In a next step 21, all inputs of the logic element 26 are identified and checked after the second test pattern run. When a disturbed input of the logic element 26 is thereby determined, then that logic element 27 whose output feeds the disturbed input is identified. In a third test pattern run, a further M−2 test patterns are applied in addition to the n−M test patterns. In a further check step 22, the inputs of the logic element 27 are then identified and checked, for example with the assistance of electron probe. When a disturbed input of the logic element 27 is again detected, then a determination is made that an output of the logic element 28 feeds the disturbed input of the logic element 27. In a fourth test pattern run, a further M−3 test patterns are applied in addition to the first n−M test patterns. As in every test pattern run, the further test patterns are applied with a frequency lower than the limit frequency fa. As in every test pattern run, the first n−M test patterns are applied with a frequency higher than the limit frequency fa. In a further test step 23, the inputs of the logic element 28 in the example of FIG. 4 are undisturbed, that output of a logic element 28 that leads to the disturbed input of the logic element 27 is identified and checked in a further check step 24. Since this output of the logic element 28 has proven disturbed in the example of FIG. 4, the logic element, excluding the assigned connecting paths, has been localized as the cause of error. Disturbed points in FIG. 4 are referenced F and undisturbed points are referenced R. The logic elements can be storing and nonstoring circuits.

Although we have described our invention by reference to particular illustrative embodiments, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method for localizing time-critical events within a clocked electronic circuit which comprises a plurality of interconnected logic elements and which has a limit frequency at which the circuit cannot function properly, comprising the steps of:
applying increasing clock frequencies to the electronic circuit and measuring the outputs of the circuit to identify the limit frequency of the circuit;
applying a sequence of test patterns to the circuit at a clock frequency which is greater than the identified limit frequency and with the test pattern sequence composed of individual test patterns which are applied in a defined succession and measuring the outputs of the circuit for an error perceived at a number n of an individual test pattern at which the error is perceived, where n is defined by the position of the individual error-causing test pattern in the test pattern sequence;
applying to the circuit the individual test patterns preceding the test pattern n in the test pattern sequence and the test pattern n in the sequence corresponding to the original test pattern sequence by applying the first n−m test patterns to the circuit with a clock frequency which is greater than the limit frequency and by applying the m test patterns following the test pattern n−m with a clock frequency which is lower than the limit frequency, where m=1 and is respectively increased by one unit after each run of the n test patterns and measuring the output after each run of the n test patterns to determine whether the error is still present at the output of the circuit; and
repeating the steps of applying the test patterns preceding the test pattern n in the test pattern sequence and the test pattern n with the first n−m test patterns applied at the clock frequency greater than the limit frequency and the m test patterns following the test pattern n−m until an error no longer appears at the output of the circuit and, therefore, an identification is made that the test pattern n−M generates the error within the circuit, where M is the number of runs of the n test patterns; and
performing error tracking to localize the cause of the error.

2. The method of claim 1, wherein the step of performing error tracking is defined as:
applying the first n−M test patterns to the circuit at a frequency greater than the limit frequency in a plurality of runs of the n test patterns;
in each run, applying the M−p test patterns following the test patterns n−M, where p=1,2 . . . , and at a frequency lower than the limit frequency of the circuit;
after each test pattern run in which p is respectively incremented in steps by one unit, checking the logical states at the output of a circuit element recognized as faulty in the preceding test pattern run as to whether a faulty logical state of the input to this circuit element is present; and
identifying at least one circuit element as causing an error by detecting a faulty logical state at the output with no faulty logical state at the input.

3. The method of claim 1, wherein the step of error path tracking is further defined as:
backtracking in m sequential stages proceeding from a faulty output of the circuit and checking the outputs and inputs of each logic element which could cause the error.

4. The method of claim 3, wherein the step of checking is further defined as:
checking only those logic elements whereat the test pattern n−M causes generation of the error.

5. The method of claim 4, and further comprising the step of:
applying additional test patterns to check the connections between the logic elements.

6. The method of claim 5, and further comprising the step of:

measuring signal values arising in response to the test patterns at internal circuit nodes by applying a probe to each node.

7. The method of claim 6, wherein the step of applying a probe is further defined as:

applying an electron probe to each node.

8. The method of claim 6, wherein the step of measuring signal values is further defined as:

applying a laser scanner to each node.

9. The method of claim 6, wherein:

the step of measuring signals is performed after two clock pulses and before the conclusion of a test run.

* * * * *